(12) United States Patent (10) Patent No.: US 7,650,457 B2
Ruckerbauer (45) Date of Patent: Jan. 19, 2010

(54) MEMORY MODULE COMPRISING A PLURALITY OF MEMORY DEVICES

(75) Inventor: Hermann Ruckerbauer, Moos (DE)

(73) Assignee: Qimonda AG, Munich (DE)

( * ) Notice: Subject to any disclaimer, the term of this patent is extended or adjusted under 35 U.S.C. 154(b) by 417 days.

(21) Appl. No.: 11/559,323

(22) Filed: Nov. 13, 2006

(65) Prior Publication Data

US 2007/0150792 A1 Jun. 28, 2007

(30) Foreign Application Priority Data

Nov. 10, 2005 (DE) ........................ 10 2005 053 625

(51) Int. Cl.
G06F 12/00 (2006.01)
G06F 13/00 (2006.01)
G06F 13/28 (2006.01)
G06F 12/02 (2006.01)
G06F 12/06 (2006.01)
G11C 5/02 (2006.01)
G11C 5/06 (2006.01)

(52) U.S. Cl. ............................. 711/5; 711/1; 711/104; 711/154; 365/51; 365/63

(58) Field of Classification Search .................. 711/104
See application file for complete search history.

(56) References Cited

U.S. PATENT DOCUMENTS 7,263,019 B2* 8/2007 Nierle et al. ................ 365/221

7,383,416 B2* 6/2008 Oeschay et al. ............. 711/211
7,414,312 B2* 8/2008 Nguyen et al. .............. 257/724
2005/0044302 A1 2/2005 Pauley et al.

FOREIGN PATENT DOCUMENTS

WO WO2005015564 A1 2/2005

OTHER PUBLICATIONS

Micron Technology, Inc.: DDR SDRAM Small-Outline DIMM MT18VDDF12872H-1GB Product Specification, Rev. A 10/04, pp. 1-26, 2004.

* cited by examiner

Primary Examiner—Christian P Chace
Assistant Examiner—Ryan Bertram
(74) Attorney, Agent, or Firm—Patterson & Sheridan, L.L.P.

(57) ABSTRACT

A memory module stores data in the form of code words, each code word comprising useful bits and check bits for error correction. The memory module contains a first group of the memory devices including check bits and a second group of the memory devices including useful bits, the second group memory devices forming ranks, each rank being addressed as a whole, the ranks forming rank groups, each rank group including at least two ranks and a first group memory device. The memory module further contains a connecting device transferring bit packets each containing useful bits and check bits in the parallel format between an interface of the memory module and the memory devices of a selected rank group.

17 Claims, 5 Drawing Sheets

FIG 3

Four (64+8) ECC code words #1 to #4 in DDR2 operation with 4x8 prefetch
First alternative

FIG 4

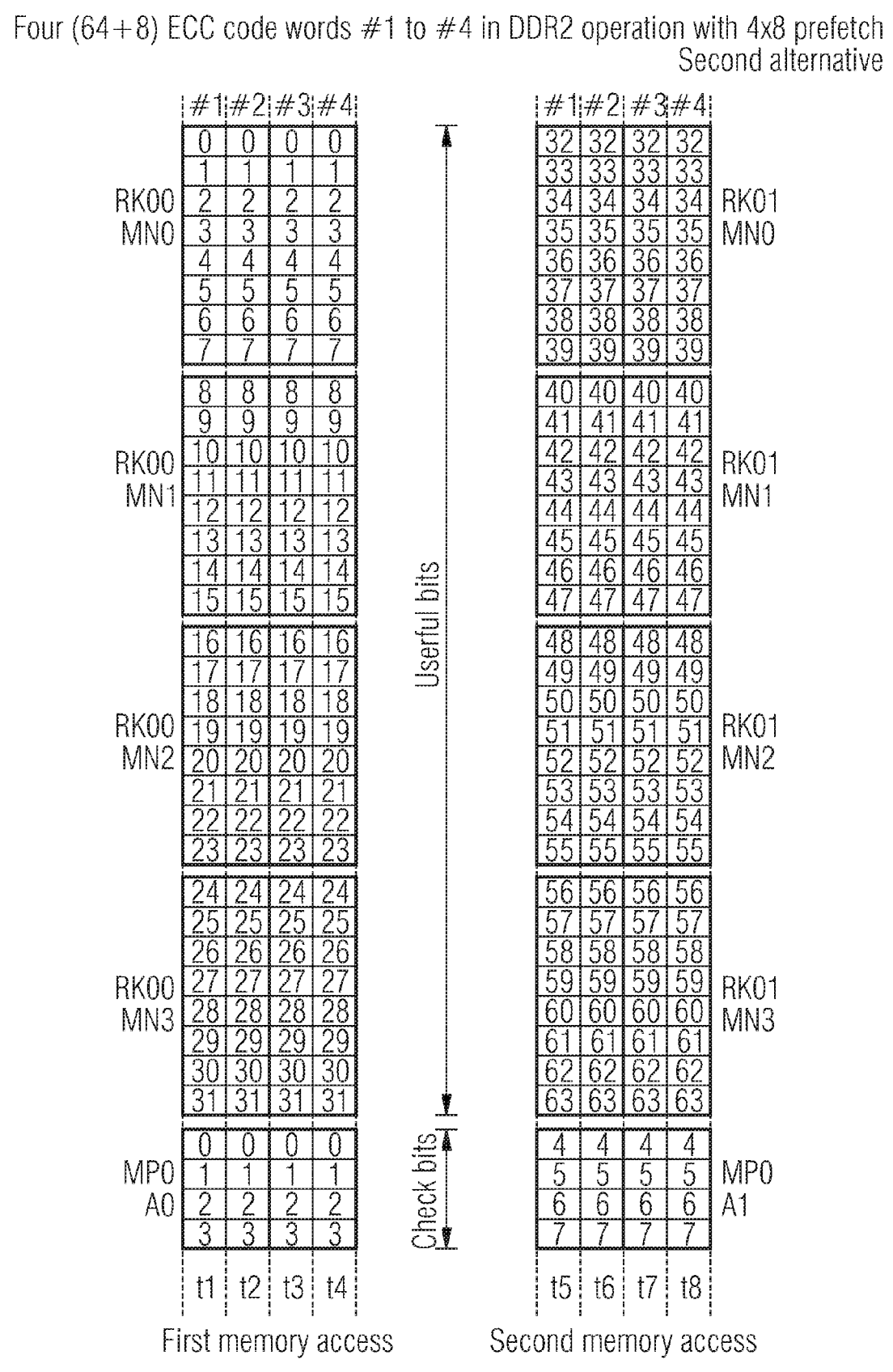

Four (64+8) ECC code words #1 to #4 in DDR2 operation with 4x8 prefetch
Second alternative

| | #1 | #2 | #3 | #4 | | | #1 | #2 | #3 | #4 | |
|---|---|---|---|---|---|---|---|---|---|---|---|
| RK00 MN0 | 0 | 0 | 0 | 0 | | RK01 MN0 | 32 | 32 | 32 | 32 | |
| | 1 | 1 | 1 | 1 | | | 33 | 33 | 33 | 33 | |
| | 2 | 2 | 2 | 2 | | | 34 | 34 | 34 | 34 | |
| | 3 | 3 | 3 | 3 | | | 35 | 35 | 35 | 35 | |
| | 4 | 4 | 4 | 4 | | | 36 | 36 | 36 | 36 | |
| | 5 | 5 | 5 | 5 | | | 37 | 37 | 37 | 37 | |
| | 6 | 6 | 6 | 6 | | | 38 | 38 | 38 | 38 | |
| | 7 | 7 | 7 | 7 | | | 39 | 39 | 39 | 39 | |
| RK00 MN1 | 8 | 8 | 8 | 8 | | RK01 MN1 | 40 | 40 | 40 | 40 | |
| | 9 | 9 | 9 | 9 | | | 41 | 41 | 41 | 41 | |
| | 10 | 10 | 10 | 10 | | | 42 | 42 | 42 | 42 | |
| | 11 | 11 | 11 | 11 | | | 43 | 43 | 43 | 43 | |
| | 12 | 12 | 12 | 12 | | | 44 | 44 | 44 | 44 | |
| | 13 | 13 | 13 | 13 | | | 45 | 45 | 45 | 45 | |
| | 14 | 14 | 14 | 14 | | | 46 | 46 | 46 | 46 | |
| | 15 | 15 | 15 | 15 | | | 47 | 47 | 47 | 47 | |
| RK00 MN2 | 16 | 16 | 16 | 16 | | RK01 MN2 | 48 | 48 | 48 | 48 | |
| | 17 | 17 | 17 | 17 | | | 49 | 49 | 49 | 49 | |
| | 18 | 18 | 18 | 18 | | | 50 | 50 | 50 | 50 | |
| | 19 | 19 | 19 | 19 | | | 51 | 51 | 51 | 51 | |
| | 20 | 20 | 20 | 20 | | | 52 | 52 | 52 | 52 | |
| | 21 | 21 | 21 | 21 | | | 53 | 53 | 53 | 53 | |
| | 22 | 22 | 22 | 22 | | | 54 | 54 | 54 | 54 | |
| | 23 | 23 | 23 | 23 | | | 55 | 55 | 55 | 55 | |
| RK00 MN3 | 24 | 24 | 24 | 24 | | RK01 MN3 | 56 | 56 | 56 | 56 | |
| | 25 | 25 | 25 | 25 | | | 57 | 57 | 57 | 57 | |
| | 26 | 26 | 26 | 26 | | | 58 | 58 | 58 | 58 | |
| | 27 | 27 | 27 | 27 | | | 59 | 59 | 59 | 59 | |
| | 28 | 28 | 28 | 28 | | | 60 | 60 | 60 | 60 | |
| | 29 | 29 | 29 | 29 | | | 61 | 61 | 61 | 61 | |
| | 30 | 30 | 30 | 30 | | | 62 | 62 | 62 | 62 | |
| | 31 | 31 | 31 | 31 | | | 63 | 63 | 63 | 63 | |
| MP0 A0 | 0 | 0 | 0 | 0 | | MP0 A1 | 4 | 4 | 4 | 4 | |
| | 1 | 1 | 1 | 1 | | | 5 | 5 | 5 | 5 | |
| | 2 | 2 | 2 | 2 | | | 6 | 6 | 6 | 6 | |
| | 3 | 3 | 3 | 3 | | | 7 | 7 | 7 | 7 | |
| | t1 | t2 | t3 | t4 | | | t5 | t6 | t7 | t8 | |

First memory access — Useful bits / Check bits — Second memory access

FIG 5

Six (64+8) ECC code words #1 bis #6, with 8x6 prefetch

MEMORY MODULE COMPRISING A PLURALITY OF MEMORY DEVICES

CROSS-REFERENCE TO RELATED APPLICATIONS

This application claims foreign priority benefits under 35 U.S.C. §119 to co-pending German patent application number DE 10 2005 053 625.5, filed 10 Nov. 2005. This related patent application is herein incorporated by reference in its entirety.

BACKGROUND OF THE INVENTION

1. Field of the Invention

The invention relates to a memory module containing a plurality of memory devices of the RAM type. As is known, the acronym RAM refers to read/write memories with direct and random access to the memory cells (random access memory). A preferred, but not exclusive, field of application of the invention constitutes memory arrangements comprising dynamic RAM devices (so-called DRAM devices), such as are customary as main memories in computers.

2. Description of the Related Art

Memory devices usually have a data port with a plurality L of parallel data terminals (data pins) in order to input and output in each case a group of L useful bits in parallel form. In the case of the memory devices that are customary at the present time, the number L is preferably an integral power of 2 and is defined by corresponding configuration of the device; customary configurations are those as ×4 device (L=4), ×8 device (L=8) and ×16 device (L=16). A controller usually serves as a source of the data to be input (write data) and a sink of the data that are output (read data), which controller also supplies the control and address bits in order to control the operation of the memory device and to select those memory cells of the memory device to which the useful bits that are input are intended to be written and from which the data to be output are intended to be read.

The transfer of the L-bit groups between the data terminals of the memory device and the controller is effected in a clock-controlled manner via a bundle of L parallel lines. In the case of "single data rate" (SDR) operation, the clock cycle of this transfer is equal to the memory clock cycle, that is to say that precisely L bits are simultaneously written or read at L selected memory cells with each memory clock cycle. In the case of m-fold data rate operation, the data transfer between the memory device and the controller is effected with a clock rate which is twice as fast as the clock rate of the memory accesses (m=2, double data rate DDR) or four times as fast (m=4, DDR2) or eight times as fast (m=8, DDR3). In these cases, during each memory clock cycle, m different L-cell groups (in m different areas of the devices) are addressed in parallel for an access in order to write or read m L-bit words in parallel. By contrast, the external transfer of the words is effected serially with an m-fold memory clock rate, a prefetch register being used for the parallel/serial conversion during reading and for the serial/parallel conversion during writing in order to collect the m L-bit words of each access.

In order to realize RAM data memories having a high storage capacity and/or having a high data throughput, it is customary for a plurality of memory devices of identical type which are in each case integrated on a chip, have the same storage capacity and are designed or set for the same x configuration (that is to say also the same number L of data terminals) to be combined to form a module on a circuit board. Modules are generally organized in such a way that in each case K devices of the module are accessed simultaneously in parallel operation in order, during each access, to write in or read out a data word comprising L*K parallel bits (the symbol * here and hereinafter represents the multiplication sign; an oblique/stands for division). Each group of K devices which are in each case accessed simultaneously in parallel operation is also referred to as a "rank". A memory module may comprise a plurality R of such ranks or just a single rank (R=1).

During operation, the module is connected to a single memory controller, which transmits the data to be written and receives the data read out and additionally transmits control bits for the memory operation. Said control bits comprise command and setting bits for controlling the operating states of the memory devices and selection bits for selecting the memory devices that are respectively to be addressed within the module and for addressing the memory cells within the respectively selected devices. For transferring the L*K-bit data words between memory module and controller, provision is usually made of a data bus having L*K parallel lines which fan out on the circuit board of the module into K so-called "lanes", each of which comprises L parallel lines and is connected to a respectively assigned memory device in each rank of the module. The number L is therefore also referred to as the lane width.

Bit errors can occur both during the transfer of the data between module and controller and during the storage of the data in the module, with the result that the so-called "integrity" of the data is not always ensured. Through suitable coding of the data words, it is possible to detect such errors with a certain probability and, if desired, also to correct them. Every coding of this type consists, in principle, in adding to the actual "useful bits", which describe the useful information of a data word, one or a plurality of "check bits", which are calculated from the useful bits according to a chosen algorithm.

For memory modules in which an improvement of the data integrity is desirable, what has become preferred in the meantime is an error correction code (ECC) in the manner of a Hamming code, in which each code word comprises 72 bits, of which 64 bits form the useful bits and 8 bits form the check bits, that is to say N=64 and P=8 ("64+8" code). This code and the Hamming algorithm that is usually taken as a basis permit not only the detection but also the correction of the occurrence of a single bit error within the code word. If precisely two bit errors occur within a code word, then this circumstance can be detected with certainty, although without the possibility of correcting these errors (by contrast, the occurrence of more than two errors within a code word is not detected with certainty). It has been shown that the probability of the occurrence of more than one bit error per 72-bit code word is negligibly low in the case of present-day memory technology, with the result that the abovementioned 64+8 Hamming code suffices in practice. However, an error correction algorithm can also be devised such that an error arising from the failure of an entire memory device can be corrected in the read-out code word.

Various schemes are known for the storage of ECC data (that is to say data which are coded with an error correction code) in a memory module, the common feature of said schemes consisting in the fact that each code word is divided into the same number of identically sized blocks as there are memory devices contained in each rank. In the case of the preferred 64+8 code, this may be effected e.g. by dividing the total of 72 bits into eight 9-bit blocks, each of which is stored in one of eight memory devices within a rank. In this case, the memory devices have to be configured as ×9 devices. This otherwise unusual configuration requires special fabrication of the devices. In this case, the addressing is effected as in the case of an ×8 device, except that a group of 9 memory cells is selected per address and 9 data pins are used at the data terminal in order to access the addressed group via 9 data lines. The bits of each ECC code word are divided in such a way that, in each device, in each case eight useful bits and one check bit are stored at an addressed 9-cell group. This has the disadvantage, however, that in the event of failure of an entire device, a check bit always fails as well. Consequently, the abovementioned technique which permits error correction in the event of failure of an entire device is made significantly more difficult or even becomes impossible.

Furthermore, ×9 devices are not advantageous if they are also intended to be used for forming a module for data operation without ECC. A manufacturer of memory modules would like to be able to supply both ECC modules and non-ECC modules, depending on the current demand. In this case, it is important for the manufacturer for stockkeeping reasons that the memory devices stocked by the manufacturer are all of the same type. If this stock consists of ×9 devices and if a non-ECC module is intended to be equipped therewith, then memory space is wasted. This will be illustrated on the bases of the exemplary case in which the non-ECC module is intended to be designed for storing 64-bit words, divided into eight 8-bit blocks for a rank of eight memory devices. In this case, the ninth data line at each ×9 device is left unutilized, and accordingly one cell remains unused in each addressed 9-cell group.

For these and other reasons, in practice an alternative scheme is preferably employed in which useful bits and check bits are stored in separate memory devices. In this case, in each rank, in addition to the plurality $K_N$ of memory devices of identical type which serve for storing the useful bits, in each case a number $K_P$ of additional devices of the same design and size and also having the same × configuration are provided for storing the check bits. The homogeneity of all the devices is desirable, to be precise for the economic reasons already discussed above and for reasons of compatibility with regard to the address structure. For the same reasons, it is not only desirable but practically essential for the number L to be an integral power $\geq 2$ of 2 (that is to say L=4, 8, . . . ), since ×1 and ×2 devices do not correspond to the conventional memory technology, that is to say are not customary commercially and would also be disadvantageous owing to the low data throughput.

In order that when using an error correction code containing N useful bits and P check bits, all of the available storage capacity in a module constructed according to the scheme described above is utilized fully, the following conditions must consequently be met:

(a) L is to be an integral power $\geq 2$ of 2;
(b) N/L must be a natural number;
(c) P/L must be a natural number;
(d) $K_N$=N/L;
(e) $K_P$=P/L.

In the case of the preferred 64+8 code, that is to say for N=64 and P=8, L can consequently only be equal to 8 or equal to 4. $K_N$=8 and $K_P$=1 thus result when using ×8 devices. $K_N$=16 and $K_P$=2 would result when using ×4 devices. In these cases, the data bus between the module and the controller comprises N+P=72 parallel conductor tracks, 64 conductor tracks being dedicated for transferring the 64 useful bits of each code word between the controller and the useful bit memory devices of the respectively selected rank. The remaining 8 conductor tracks are dedicated for transferring the 8 check bits of the code word between the controller and the check bit memory device(s). The address bits for the selection of the memory cells within the devices of the respectively selected rank are identical for all these devices.

A module of the type described above may optionally also be used for data storage without an error correction code. In this case, with each clock cycle only 64 useful bits are transferred via the dedicated 64 useful bit conductor tracks of the bus between the controller and the memory devices of the selected rank. The remaining 8 conductor tracks of the bus and also the check bit memory device(s) in each rank then remain unused.

There are cases in which it becomes problematic to meet all the abovementioned conditions (a) to (e). One such case exists for example if the clock rate of the data transfer between controller and module is so high that a differential, that is to say two-core, line has to be used in the bus and in the lanes for each bit stream. This situation can arise particularly in the case of multiple data rate operation.

In order to provide a two-core line for each bit stream in the bus, the number of conductor tracks in the bus could be doubled, but this is often undesirable, inter alia for space reasons. Consequently, the only solution that remains is to reduce the effective bus width to half. That is to say that instead of N+P parallel bits, only (N+P)/2 parallel bits can be transferred on the N+P conductor tracks present. Each (N+P)-bit code word of the error correction code therefore has to be divided into two successive parts. In the case of the preferred 64+8 code, this means that each partial code word contains 36 parallel bits, namely 32 useful bits and 4 check bits.

For this case, the abovementioned conditions (a) to (e) could be met only if all the devices are configured as ×4 devices, the number $K_N$ of useful bit memory devices per rank is chosen to be equal to 8 and a ninth device of identical type is provided as a check bit device for each rank. However, the higher the data rate and thus the prefetch m, the higher, too, the instantaneous current consumption of a memory device per access becomes, so that it is desirable for the number of memory devices that are to be addressed simultaneously to be kept smaller.

One alternative is still to use ×8 devices, but to reduce the number $K_N$ of useful bit memory devices per rank to ½*N/L (that is to say to N/2L). For the case of the preferred 64+8 code, this means that $K_N$=4, that is to say is smaller by half than what is required by condition (d) above. This has the consequence, however, that the additional check bit memory device in the rank has only half as many bits to store as each useful bit memory device. If all the devices are intended to be identical to one another, which is expedient for the reasons mentioned above, then the available total storage capacity of the module is not completely utilized, which is uneconomic. Although this disadvantage could be eliminated by using a memory device having half the capacity ("half-dense memory device") for check bit storage in each rank, said memory device is often not readily available or else belongs to an older technology generation, the products of which cannot readily be combined with the current generation (e.g. for reasons of the supply voltage). One solution would be to entirely omit the additional check bit memory device and to configure all the remaining four devices as ×9 devices. However, this would result in the disadvantages as have been described further above in conjunction with the ×9 configuration.

The situation described above is only one example for illustrating the problems which might arise if the number $K_N$ of useful bit memory devices per rank were less than the ratio N/L for any reasons. Such a situation might arise not only on account of a desirable two-core constitution of the bus lines, but also e.g. if use were made of an error correction code in the case of which the ratio N/P is not equal to L.

SUMMARY OF THE INVENTION

Various aspects of the present invention can provide particular advantages for a memory module.

According to a first aspect of the invention a memory module stores data in the form of code words, each code word comprising useful bits and check bits for error correction. The memory module contains a first group of the memory devices including check bits and a second group of the memory devices including useful bits, the second group memory devices forming ranks, each rank being addressed as a whole, the ranks forming rank groups, each rank group including at least two ranks and a first group memory device. The memory module further contains a connecting device transferring bit packets each containing useful bits and check bits in the parallel format between an interface of the memory module and the memory devices of a selected rank group.

According to a second aspect of the invention a memory module stores data in the form of code words which each comprise N useful bits and P check bits for error correction, the ratio N/P being an integer V. The memory module contains a plurality of memory devices of the RAM type having the same storage capacity, a subset of the memory devices being dedicated to the check bits and the remainder of the memory devices being dedicated to the useful bits, each $K_N$ useful bit memory devices being combined in a rank which is addressed as a whole in order to transfer L bits in parallel form at L data terminals of each memory device of the rank, each R ranks being combined in a group which precisely includes one individually assigned check bit memory device, wherein $K_N=V/R$ and $Q=P/R$, R being equal to an integer >1. The memory module further contains a connecting device transferring bit packets each containing $L*K_N$ useful bits and Q check bits in the parallel format between an interface of the memory module and a selected rank group.

BRIEF DESCRIPTION OF THE DRAWINGS

These above recited features of the present invention will become clear from the following description, taking in conjunction with the accompanying drawings. It is to be noted, however, that the accompanying drawings illustrate only typical embodiments of the present invention and are, therefore, not to be considered limiting of the scope of the invention. The present invention may admit other equally effective embodiments.

FIGS. 3 and 4 illustrate two alternatives for the division of the bits of a (64+8) ECC code word when writing and reading at a memory module according to FIG. 1 during operation with 4×8 prefetch (quadruple data rate, DDR2).

FIG. 5 illustrates the division of the bits of a (64+8) ECC code word when writing and reading at a memory module according to FIG. 1 during operation with 8×6 prefetch.

DETAILED DESCRIPTION OF THE PREFERRED EMBODIMENT

Figure 1:
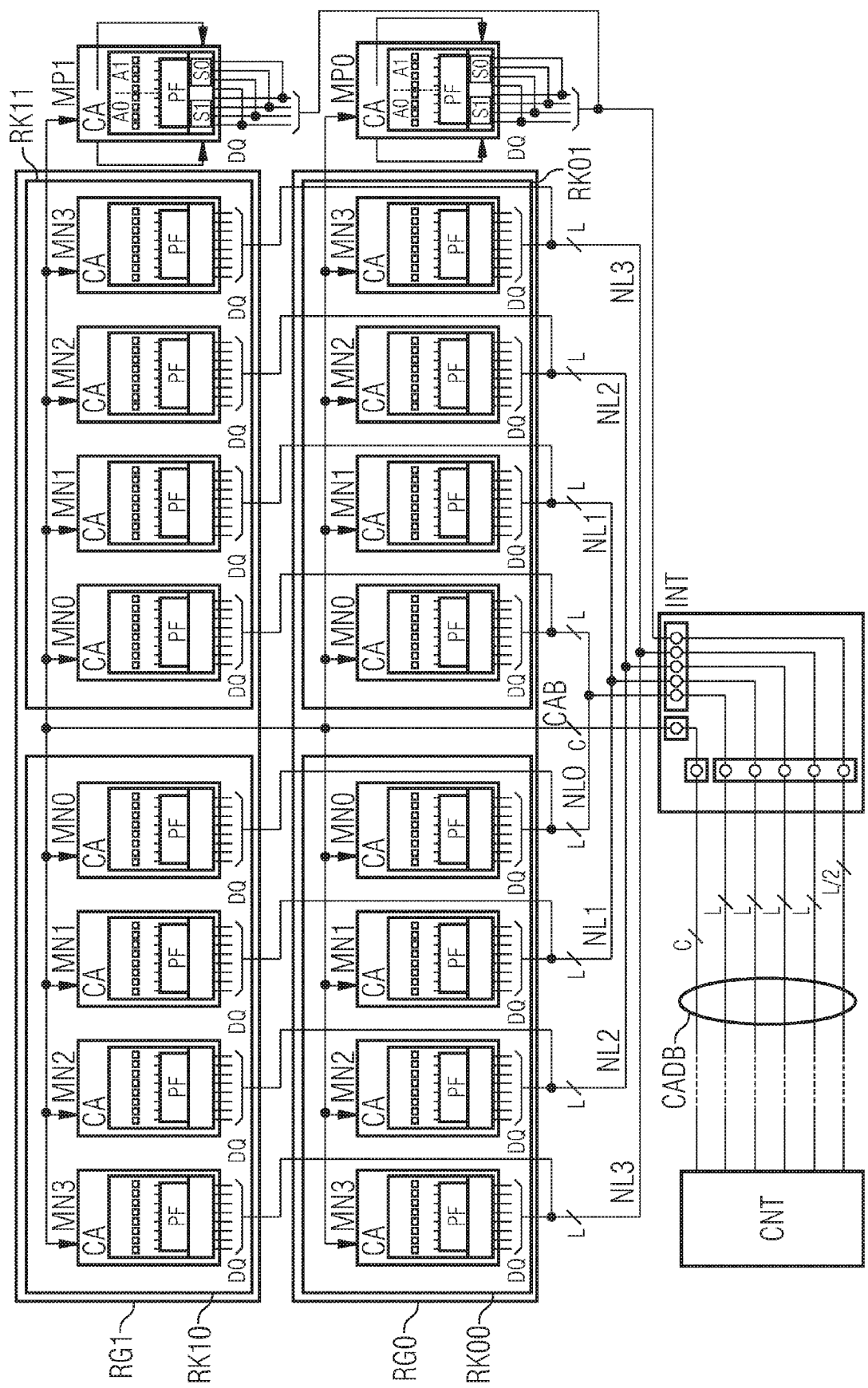
FIG. 1 shows the schematic of the construction of a memory module according to the invention for ECC code words each comprising N=64 useful bits and P=8 check bits.

In FIG. 1, elements of identical type are designated by the same letter combinations each succeeded by a number or number combination for identifying the relevant element. A colon between two numbers denotes the word "to"; thus, e.g. "MN0:3" is to be read as "MN0 to MN3".

The memory module illustrated schematically in FIG. 1 contains two rank groups RG0 and RG1, each of which comprises R=2 ranks RK00, RK01 and RK10, RK11, respectively. Each rank contains $K_N=4$ useful bit memory devices MN0:3, each of which has a bidirectional data port DQ with L=8 pins for inputting and outputting a group of L=8 parallel bits which are intended to be written and read at a respectively selected group of L=8 memory cells (L-cell group). The relevant 8-cell group is selected depending on the pattern of a plurality of address bits which are received at assigned pins of a control and address terminal CA. In FIG. 1, in each useful bit memory device, an 8-cell group of this type is symbolically illustrated by in each case 8 small squares lying next to one another.

During m-fold data rate operation, a number m of L-cell groups are accessed simultaneously with each memory clock cycle, as described further above. For this purpose, each useful bit memory device MN contains a prefetch register PF for buffer-storing m*L bits which are input and output as a burst having the width L and length m via the data port DQ. During "single data rate" (SDR) operation, m=1.

For each rank group RG0 and RG1, the module in each case contains an individually assigned check bit memory device MP0 and MP1, respectively. All the memory devices, that is to say the in total 16 useful bit memory devices and the two check bit memory devices, are identical to one another with regard to their storage capacity and with regard to the "width" L of their data ports DQ. In the exemplary embodiment illustrated (L=8), each memory device is therefore configured as an ×8 device. FIG. 1 likewise depicts an 8-cell group in each check bit memory device; a separating line drawn in dashed fashion symbolizes a subdivision of each 8-cell group into R=2 identically sized segments A0 and A1 (4 cells in each case).

A total of $K_N=4$ useful bit lanes NL0:3 are provided, each of which can transfer L=8 bits in parallel. Each of these useful bit lanes is connected to the DQ terminals in each case of an individually assigned useful bit memory device in each rank. That is to say that the lane NL0 is connected to the useful bit devices MN0 of all the ranks, the lane NL1 is connected to the useful bit devices MN1 of all the ranks, etc., as shown in FIG. 1. The other ends of the useful bit lanes NL0:3 are connected to corresponding terminals of a common interface INT. A check bit lane PL is additionally provided, which can transfer in parallel L/2=4 bits in the parallel format between assigned terminals of the interface INT and data pins of the check bit devices MP0, MP1.

The control and address terminal CA of each memory device receives not only the selection bits for activating the relevant device ("chip select") and for addressing the memory cell groups (in each case one 8-cell group in SDR operation and m 8-cell groups during operation with m*8 prefetch) but also further control bits for the control and setting of the operation of the memory device. Since all $K_N=4$ memory devices of a rank are in each case intended to be activated simultaneously, the indication of the rank group and the indication of the rank within the rank group suffice for device selection. A two-bit information item is required for this purpose in the exemplary embodiment shown. The number of address bits for the selection of the cell group within a memory device is, of course, dependent on the size (storage capacity) of the device.

The device selection bits and cell group address bits and also the further control bits for controlling the operation can be applied to the CA terminals of all the memory devices of the module via a common internal control bus CAB, the lines of which are connected to corresponding terminals of the interface INT, as shown in FIG. 1. In this case, two chip select pins and one decoder would have to be provided at each memory device in order to decode the two-bit information for the activation of the device. If only one chip select pin is present, then a common decoder would have to be provided at the start of the control bus or in the interface INT, said common decoder activating one of four bus lines within the control bus CAB depending on the 2-bit information, the first bus line thereof leading to the chip select pin of all the useful bit memory devices of the rank RK00 and of the check bit device MP0, and the second bus line thereof leading to the chip select pin of all the useful bit memory devices of the rank RK01 and of the check bit device MP0, and the third bus line thereof leading to the chip select pin of all the useful bit memory devices of the rank RK10 and of the check bit device MP1, and the fourth bus line thereof leading to the chip select pin of all the useful bit memory devices of the rank RK11 and of the check bit device MP1.

Therefore, from the selection bits at the CA terminal of a selected check bit memory device, it is also possible in any case to derive an information item specifying which rank is selected within the rank group assigned to said check bit device. Depending on this information, a decision is made at the check bit device as to which segment A0 or A1 of each addressed 8-cell group is intended to be accessed for the writing or reading of 4 check bits at said cell group.

As mentioned, an ECC memory module of the type shown in FIG. 1 may be designed for single data rate operation (SDR operation, m=1) or for a multiple data rate operation (m>1). Depending on the operating mode, there may be various schemes for dividing the code word bits into bit packets, for the order in which the bit packets are transferred between the memory devices and the common interface INT, and for the assignment of the bits of each bit packet to the memory devices.

FIGS. 2 to 5 show some of such schemes in charts. In each of these figures, the bits are symbolized as small squares in which are entered numbers from 0 to 63 for numbering the N=64 useful bits of a code word, and numbers from 0 to 7 for numbering the P=8 check bits of a code word. The illustrations relate to the accesses at the rank group RG0 and at the assigned check bit memory device MP0. Each figure shows an overall matrix of m*R columns and $L*K_N+K_N/R$ rows. Each of said columns contains the bits of a respective bit packet which is transferred in a single period of the transfer clock sequence t1, t2, . . . between the common interface INT and the data terminals DQ of the respectively selected memory devices.

In each of FIGS. 2 to 5, the overall matrix illustrated is divided into individual blocks, in each case one for each of the useful bit memory devices MN0:3 of each rank RK00, RK01 of the selected rank group RG0 and in each case one for each memory area A0, A1 of the assigned check bit device MP0. Each block forms a partial matrix each containing all the bits which are written or read at the relevant memory device or memory area in the event of a memory access.

Figure 2:
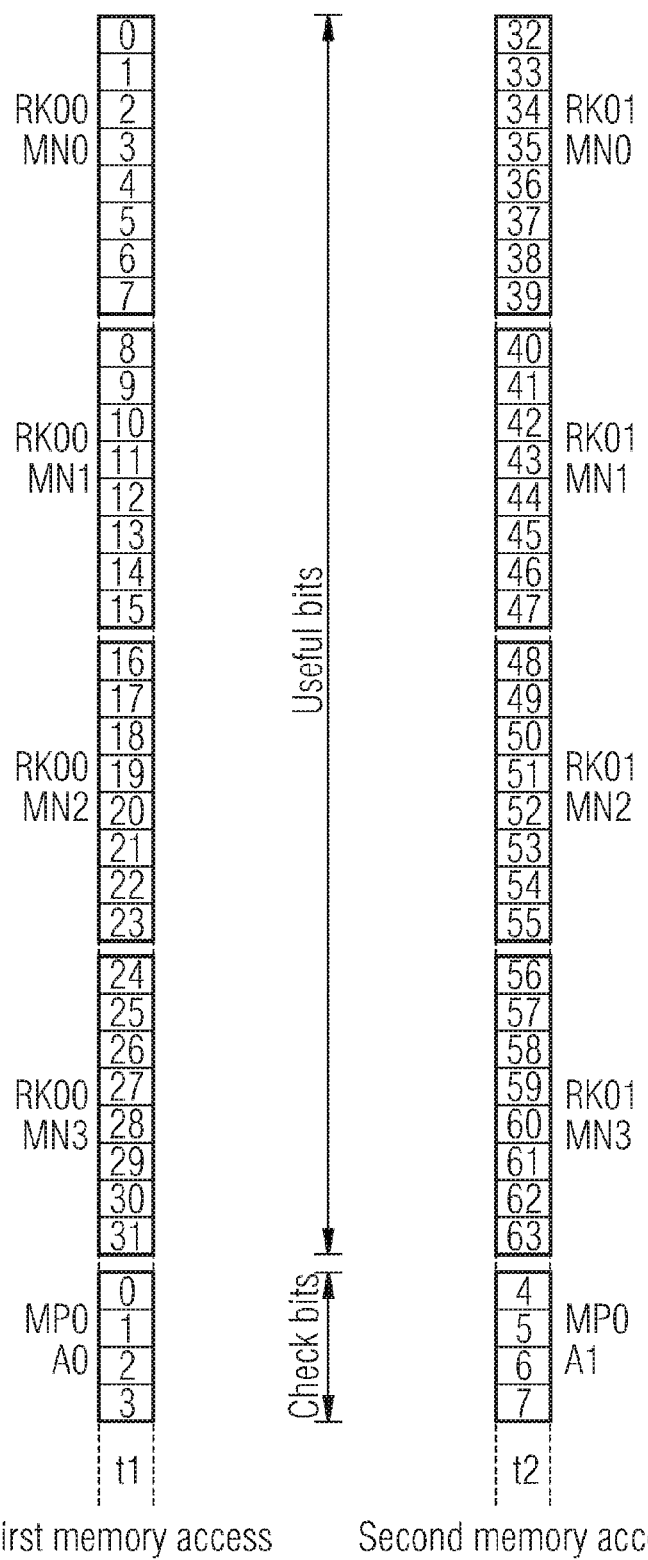
FIG. 2 illustrates the division of the bits of a (64+8) ECC code word at a memory module according to FIG. 1 in the case of single data rate operation (SDR operation).

FIG. 2 shows the division of the code word bits in SDR operation. During SDR operation, m=1, and a code word is written in R successive accesses to the same rank group. During each access, only one packet of in each case N/R=N/2=32 useful bits and P/R=P/2=4 check bits of the relevant code word is intended to be written for each of the code words. In a first clock period t1, for writing the first bit packet of the code word, all four memory devices M0:3 of the first rank RK00 of the rank group RG0 and the assigned check bit device MP0 are selected, with the addressing of a group $ZG_n$ of L=8 memory cells in each of said devices. At the same time, the first bit packet, comprising the first 32 useful bits D0:31, is applied, in parallel and divided uniformly into in each case L=8 bits, to the KN=4 useful bit lanes NL0:3, and the first L/R=4 check bits P0:3 are applied to the check bit lane PL. A write command at the CA terminals has the effect that the useful bits D0:31 are written to the addressed cell groups $ZG_n$ of the devices MN0:3 of the rank RG00, and that the 4 check bits P0:3 are written to the segment A0 of the addressed cell group $ZG_n$ of the check bit device MP0. The targeted selection of the segment can be effected by any suitable mechanism, as is described further below.

In a second clock period t2, for writing the second bit packet of the same code word, all the useful bit memory devices MN0:3 of the second rank RK01 of the same rank group RG0 and the same check bit device MP0 are selected, using the same cell group addressing as in the case of the first bit packet. At the same time, the second 32 useful bits D32:63 of the code word to be written are applied in parallel to the group of the four useful bit lanes NL0:3, and the second 4 check bits P4:7 are applied to the check bit lane PL. A write command at the CA terminals then has the effect that the useful bits D32:63 are written to the addressed cell groups $ZG_n$ of the devices MN0:3 of the rank RK01, and that the four check bits P0:3 are written to the segment A1 of the addressed cell group $ZG_n$ of the check bit device MP0. By this means, all 64 useful bits of the code word are stored in the rank group RG0, and the 8 check bits of the code word are stored in the assigned check bit device MP0.

The writing of B successive code words in SDR operation may take place as follows: firstly, the first access described above is carried out B times in succession, and upon each repetition only the cell group addressing is changed, e.g. by means of an internal address counter, in order to successively address B cell groups $ZG_n$, $ZG_{n+1}$, $ZG_{n+2}$, etc. at the same selected memory devices. Simultaneously with each cell group addressing, the first bit packet of a respective other one of the B code words is applied to the lanes NL0:3 and PL. The second access described above is then carried out B times in succession, and upon each repetition once again only the cell group addressing is changed in order to successively address B cell groups $ZG_n$, $ZG_{n+1}$, $ZG_{n+2}$, etc. at the same selected memory devices. Simultaneously with each cell group addressing, the second bit packet of a respective other one of the B code words is applied to the lanes NL0:3 and PL.

The read-out of a code word or of a code word burst in SDR operation is likewise effected by means of two temporally separate accesses for each of the two bit packets according to the same selection scheme as was described above for writing.

In order to select the respectively desired segment A0 or A1 in the check bit memory device during each access, it is possible to use a suitable selection device which causes the data transfer between the check bit lane PL and the addressed cell group to proceed optionally either via a first segment of four data pins at the DQ terminal of the device (e.g. pins Nos 0:3), which leads to the four cells of the segment A0 of the addressed cell group, or via the other data pin segment (pins Nos 4:7), which leads to the four cells of the segment A1 of the addressed cell group.

In FIG. 1, said selection device is symbolized by a branching of the 4-bit lane PL to two 4-pin segments of the 8-pin data terminal DQ, in which case it is possible to selectively activate an assigned blocking device S0 or S1 in the memory device for each branch. These devices are controlled by the information that can be derived at the CA terminal about which of the two ranks is selected in the assigned rank group. Upon selection of the first rank (e.g. RK00), S1 is activated in order to block the data transfer between the cell group segment A1 and the lane PL, and upon selection of the second rank (e.g. RK01) S0 is activated in order to block the data transfer between the cell group segment A0 and the lane PL.

In practice, the selective blocking can be effected during writing by masking means within the device, as are provided in many commercially available memory chips. The selective blocking of the read data may be made possible by configuring the output drivers on the internal data lines of the memory device as drivers having a tristate output and by switching into the high-impedance state (so-called "Z state") in each case those outputs from which no data are intended to be transferred to the assigned data pins. Another possibility consists, during each read access, in transferring the content of the entire addressed cell group (that is to say both segments) of the check bit memory device via the L=8 data pins thereof and a check bit lane having the width L to the controller CNT and in ignoring in the controller those bits which do not originate from that area of the check bit memory device which is assigned to the respectively selected rank.

Multiple data rate operation, that is to say where m>1, proceeds, in principle, in a manner similar to that described above for SDR operation. The difference is that m disjoint groups of in each case L=8 memory cells are addressed simultaneously during each memory clock cycle in order to simultaneously write or read m different 8-bit groups at said cell groups.

In m-fold data rate operation, a total of m (64+8) code words can be written or read by means of R=2 write or read operations at the module according to FIG. 1. There are various possibilities as to the way and order in which the m*2 bit packets required for the transfer of the m code words between the memory devices and the interface of the module can be divided between the R=2 ranks of a rank group. Two alternatives will be described below:

In accordance with a first alternative illustrated for the example m=4 in FIG. 3, for writing, firstly, in m=4 successive periods t1 to t4 of the transfer clock cycle, all m bit packets which form the first m/2=2 complete code words #1 and #2 are successively transferred at a high data rate to the useful bit memory devices MN0:3 of the first rank (e.g. RK00) of a rank group (e.g. RG0) and to the assigned check bit device (MP0). In each device, the relevant bits of the m successive packets are in each case collected in a prefetch register before a write command ensures that they are written in parallel to the m addressed cell groups of the useful bit memory devices and to the segments A0 of the m addressed cell groups of the assigned check bit device. The same performance is subsequently effected at the second rank (e.g. RK01) of the same rank group and at the same check bit device with the m bit packets which form the remaining m/2=2 code words #3 and #4, the segments A1 of the m addressed cell groups being selected in the check bit device. Each of the blocks (partial matrices) depicted in FIG. 3 represents the content of the prefetch register of the relevant memory device.

In accordance with a second alternative illustrated in FIG. 4, for writing, firstly, in m successive periods t1 to t4 of the transfer clock cycle, the first bit packets (useful bits 0:31, check bits 0:3) of m=4 different code words #1, #2, #3, #4 are successively transmitted at a high data rate to the useful bit memory devices MN0:3 of the first rank (e.g. RK00) of a rank group (e.g. RG0) and to the assigned check bit device (MP0). In each device, the relevant bits of the m successive packets are in each case collected in a prefetch register before a write command ensures that they are written in parallel to the m addressed cell groups of the useful bit memory devices and to the segments A0 of the m addressed cell groups of the assigned check bit device. Afterward, in four further clock periods t5 to t8, the same performance is effected at the second rank (e.g. RK01) of the same rank group and at the same check bit device with the second bit packets (useful bits 32:63, check bits 4:7) of the code words #1 to #4, the segments A1 of the m addressed cell groups being selected in the check bit device. In FIG. 4, too, each of the blocks depicted represents the content of the prefetch register of the relevant memory device.

The alternative illustrated in FIG. 4 has the advantage that if a single data line in any lane or in the external data bus fails or effects erroneous transfer, only one bit per data word becomes erroneous, that is to say can easily be corrected. In the case of the first alternative according to FIG. 3, more than one bit per data word become erroneous in such a case.

In m-fold data rate read operation, firstly a read command ensures that the bits of in each case m bit packets that are to be output at the memory devices of the respectively selected rank are transferred from the assigned memory cells into the prefetch registers before they are transferred at a high data rate in m successive transfer clock cycles to the interface of the module.

The writing and reading at the other rank group RG1 is effected in the same way as was described above for the rank group RG0. Of course, the module may, if desired, contain just a single rank group or more than two rank groups, which may all be formed and operated in the same way as described above.

In the case of the described embodiment according to FIG. 1, the first segments A0 of all the 8-cell groups within a check bit memory device taken together are to be regarded as a first memory area, and the second segments A1 of all the 8-cell groups accordingly form a second memory area. This area classification has the advantage that all the devices are configured as ×8 devices, that is to say have the same x configuration.

As an alternative, the check bit devices may also be configured as ×4 devices, with the result that an individual addressing of 4-cell groups is possible. In this case, half the number of all these cell groups can form one memory area A0, while the remaining cell groups form the other memory area A1. This has the advantage that the masking of bits during writing and reading is obviated.

The interface INT is illustrated in FIG. 1 as a simple through-port which can connect all four 8-bit lanes NL0:3 and the 4-bit lane PL and also the control bus CAB to corresponding lines of an external control and data bus CADB, which, for its part, is connected to a memory controller CNT. If desired, a buffer in the form of a FIFO register (not shown) may be provided within the interface INT.

In the case shown, the external bus CADB contains, in addition to the command bit lines and selection bit lines, a total of 36 data lines for the transmission and reception of 32 useful bits and 4 check bits simultaneously. The controller CNT transmits the control bits for the selection of the memory cells and for the control of the operation of the memory devices and also determines the clock timing of the memory accesses at the module. The coding of the data to be stored (that is to say the formation of the ECC code words by adding the P check bits to in each case N useful bits) and the error checking and error correction of the useful bits of the ECC code words read out may be effected in the usual manner by means of a suitable ECC coder or a suitable error correction circuit in the controller.

A memory module of the type shown in FIG. 1 may also be used, without far-reaching changes, for storing data words containing no check bits (non-ECC operation). In this case, the check bit memory devices are not used, and, if desired, it is possible in this case to enable writing or reading of in each case 64 parallel bits per access by virtue of the four 8-bit lanes for each rank of respectively the same rank group being kept separate from one another in the interface INT, thus resulting in 8 separate 8-bit lanes which can be connected to the controller via 64 lines in an external bus. In the case of such a configuration, each rank group functionally becomes a single rank. If a two-core line is in each case provided in the external bus CADB for each bit of a bit packet of an ECC code word, that is to say 36 conductor pairs in the case of (64+8)-bit code words and consequently 72 conductors, then it is possible, in non-ECC operation, to utilize 64 conductors as 64 single-core lines for the parallel transfer of a 64-bit data word.

The invention is not restricted to the embodiment shown in FIG. 1. Depending on the values for D, P and L and depending on the data width of the external bus CADB, it is also possible to provide more than two ranks per rank group, in which case the number of memory areas in each check bit memory device has to be correspondingly increased (with a corresponding reduction in the size of the areas). It should furthermore be mentioned that the number of rank groups may also be less than or greater than 2, depending on the desired overall storage capacity of the module.

In the case of the embodiments discussed above, the quotient $N/(K_N*L)$ is a natural number (that is to say an integer $\geq 1$), which in turn presupposes that the quotient N/L is also a natural number. However, a memory module according to the invention is not restricted to this integrality. In principle, a memory module according to the invention can be realized with any desired lane width L. If the quotient $N/(K_N*L)$ is not a natural number, then a code word cannot be divided into a whole number of successive bit packets for transfer between the common interface INT and the memory devices. In order nevertheless to give all the bit packets the same width, a suitable number of filler bits can be inserted in at least one of the bit packets for each memory access. In write operation, the filler bits are inserted on the part of the controller and are masked in the course of writing in the relevant memory devices. In read operation, the filler bits are inserted in the memory devices and masked in the controller.

However, the insertion of filler bits can reduce the throughput of the module (number of transferred code word bits per unit time). It is possible, however, to avoid filler bits by operating the memory devices with a prefetch for a burst whose length m is dimensioned such that the quotient $(K_N*L*m)/N$ is a natural number.

Figure 5:
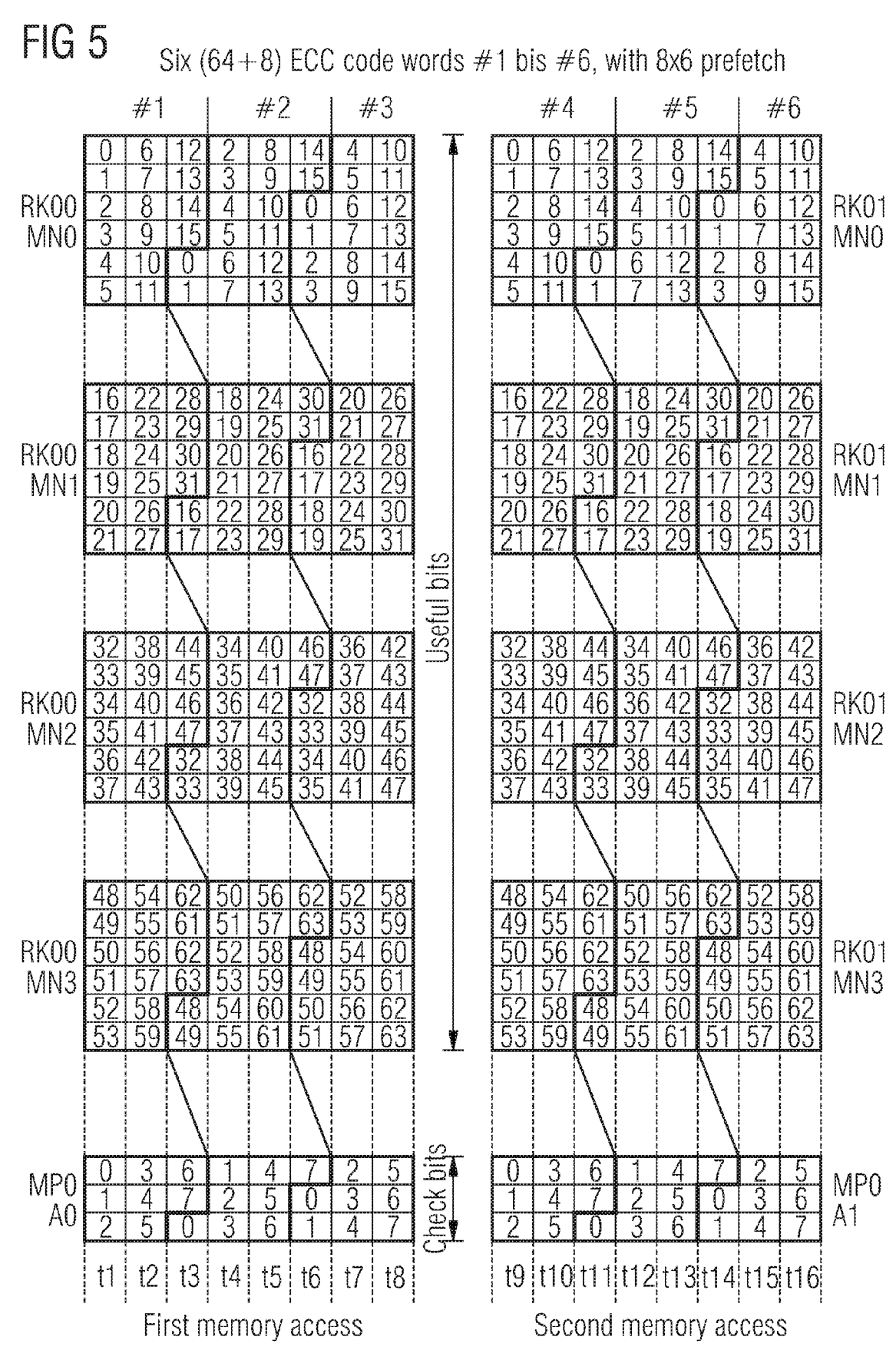

FIG. 5 illustrates as an example how the bits of (64+8) code words can be divided between the memory devices of a module according to FIG. 1 without filler bits if the lane width L is equal to 6. In this case, the quotient $N/(K_N*L)$ is equal to 64/24=2+2/3, that is to say is not integral as in the cases in accordance with FIGS. 2 to 4. The above condition where $(K_N*L*m)/N$ is a natural number is met if m is equal to 8 (or a multiple of 8). FIG. 5 shows the case m=8. Consequently, the memory devices each contain a prefetch register for buffer-storing a burst of L*m=6*8=48 bits which can take up in each case $N/K_N$ bits of three code words.

In the example according to FIG. 5, firstly a first memory access is effected at the module, in the case of which all the useful bits and check bits of three first code words #1 to #3 are transferred via the lanes NL0:3 and PL between the interface INT and the prefetch registers of the useful bit memory devices MN0:3 of the first rank RK0 and the prefetch register of the check bit memory device MP0. This is done by means of a burst of m=8 successive bit packets over m=8 periods t1 to t8 of the transfer clock cycle, each bit packet containing $K_N*L=4*6=24$ useful bits and L/R=6/2=3 check bits. This is followed by a second memory access, in the case of which, in a similar manner, all the useful bits and the check bits of three further code words #4 to #6 are transferred via the same lanes NL0:3 and PL between the interface INT and the prefetch registers of the useful bit memory devices MN0:3 of the second rank RK0 and the prefetch register of the check bit memory device MP0. This is done in m=8 successive bit packets over m=8 periods t9 to t16 of the transfer clock cycle.

The transfer of the bits between the prefetch registers and the memory cells of the relevant devices can be effected within a single clock period in parallel form, in a plurality of successive clock periods in groups each comprising a plurality of bits, preferably each comprising m bits (or an integral multiple thereof). If, as in the case of the example according to FIG. 5, m=8, then the memory devices can be configured as ×8 devices with regard to the accesses to the memory cells, even though the lane width L is not equal to 8.

A memory module according to the invention can also be used in conjunction with a controller which transmits the data burst, containing the bit packets that are respectively to be written, and a "control burst", containing command and selection bits, via the same lines of a bus, to be precise temporally successively, in each case as a burst having the same width corresponding to the number of lines of said bus. For read operation, too, the controller can transmit the necessary control bits as a burst via said bus lines before the actual read-out of the code words is effected. In this case, the code word bits that are read can be transferred via the same lanes and bus lines as the code words bits to be written, or via separate data lines. In the latter case, the burst width for the read bits may be different than the burst width for the write bits.

It should be pointed out that the expression "natural number" used in the text above and in the patent claims means in each case "integer $\geq 1$", that is to say a positive integer excluding zero. It is inherently the case that all the parameters N, P, $K_N$, $K_P$, R, L, B and m mentioned in the text above and in the patent claims are such natural numbers, even though this circumstance is not expressly mentioned every time.

The invention can provide a plurality of advantages. Several advantages which on first impression appear to contradict one another may be fulfilled simultaneously:

Firstly, the peak current consumption during each access can be kept relatively small because the number of memory devices that are to be addressed simultaneously per access can be kept relatively small.

Secondly, it is possible to fully utilize the total available storage capacity during operation with an ECC data format even though, on the one hand, all the memory devices (that is to say both the useful bit and the check bit memory devices) are identical to one another and, on the other hand, the number $K_N$ of useful bit devices per rank is less than N/L.

Thirdly, the width of the data port at the interface and thus the width of the data bus between the module and a controller can be chosen to be significantly less than the width of the ECC code words. This permits a two-core configuration of the bus lines for high data rates without the need for the number of conductor tracks to be twice as high as the number of bits per code word.

Fourthly, the lane width L is not restricted to integral fractions of the number N of useful bits per code word.

Fifthly, the module can also be used for operation with a normal data format, (that is to say a non-ECC format) without the need to change the configuration of the memory devices.

The preceding description describes advantageous exemplary embodiments of the invention. The features disclosed therein and the claims and the drawings can, therefore, be useful for realizing the invention in its various embodiments, both individually and in any combination. While the foregoing is directed to embodiments of the present invention, other and further embodiments of this invention may be devised without departing from the basic scope of the invention, the scope of the present invention being determined by the claims that follow.

What is claimed is:

1. A memory module storing data in the form of code words, each code word comprising useful bits and check bits for error correction, the memory module comprising:
    a first group of memory devices including check bits and a second group of memory devices including useful bits, the memory devices of the second group forming ranks, each rank being addressed as a whole, wherein the first group of memory devices and the second group of memory devices form a plurality of rank groups, each rank group including at least two ranks and a memory device from the first groups, wherein memory areas are defined in each memory device of the first group, each of said memory areas being individually assigned to a rank of the selected rank group;
    an interface; and
    a connecting device transferring bit packets each containing useful bits and check bits in the parallel format between the interface and the memory devices of a selected rank group; and
    an access control device configured to write code words, the access control device being activated in order to select, for each bit packet, a rank of the selected rank group and to input useful bits to all the memory devices of the second group of the selected rank, and simultaneously to select, from the memory device, of the first group, assigned to the selected rank group, that area which is assigned to the selected rank, and to input check bits to the selected area of the memory device of the first group.

2. The memory module of claim 1, wherein all the memory devices are of random access memory (RAM) type having the same storage capacity.

3. The memory module of claim 1, further comprising:
    an access control device configured to read code words, the access control device being activated in order to select, for each bit packet, a rank of the selected rank group and to output useful bits from all the memory devices of the second group of the selected rank, and simultaneously to select, from the memory device, of the first group, assigned to the selected rank group, that area which is assigned to the selected rank, and to output check bits from the selected area of the memory device of the first group.

4. The memory module of claim 1, wherein
    each memory device has a prefetch register in order to buffer-store a burst containing bits of successive bit packets that are to be written to a respective memory device; and
    the access control device is activated during a write operation in order to transfer, at each respective memory device after inputting of the bits of a burst, the content of the respective prefetch register in the parallel format to assigned memory cells.

5. The memory module of claim 3, wherein
    each memory device has a prefetch register in order to buffer-store a burst containing bits of successive bit packets that are to be read from the respective memory device; and
    the access control device is activated during a read operation in order to transfer, at each respective memory device, the bits of a burst to be output in the parallel format from assigned memory cells into the respective prefetch register.

6. A memory module storing data in the form of code words which each comprise N useful bits and P check bits for error correction, the ratio N/P being an integer V, the memory module, comprising:
    a plurality of random access memory devices having the same storage capacity, a subset of the memory devices being dedicated to the check bits and the remainder of the memory devices being dedicated to the useful bits, each KN memory devices of the remainder being combined in a rank which is addressed as a whole in order to transfer L bits in parallel form at L data terminals of each memory device of the rank, each R ranks being combined in a group which includes one individually assigned memory device of the subset, wherein KN =V1R, R being equal to an integer>1;
    an interface; and
    a connecting device transferring bit packets each containing L*KN useful bits and Q check bits in the parallel format between the interface and a selected rank group, wherein Q=P/R.

7. The memory module of claim 6, wherein
    each R disjoint memory areas are defined in each memory device of the subset, each of the memory areas being individually assigned to a rank of the selected rank group.

8. The memory module of claim 6, further comprising:
    an access control device configured to write code words, the access control device being activated in order to select, for each bit packet, a rank of the selected rank group and to input L useful bits to all the memory devices, of the remainder, of the selected rank; and simultaneously to select, from the memory device, of the subset, assigned to the selected rank group, that area which is assigned to the selected rank, and to input L/R check bits to the selected area of the memory device of the subset.

9. The memory module of claim 6, further comprising:
    an access control device configured to read code words, the access control device being activated in order to select, for each bit packet, a rank of the selected rank group and to output L useful bits from all the memory devices, of the remainder, of the selected rank; and simultaneously to select, from the memory device, of the subset, assigned to the selected rank group, that area which is assigned to the selected rank, and to output L/R check bits from the selected area of the memory device of the subset.

10. The memory module of claim 8, wherein
    each memory device has a prefetch register in order to buffer-store a burst containing bits of $m \geq 2$ successive bit packets that are to be written to a respective memory device; and
    the access control device is activated during a write operation in order to transfer, at each respective memory device after the inputting of the bits of a burst, the content of the respective prefetch register in the parallel format to assigned memory cells.

11. The memory module of claim 9, wherein each memory device has a prefetch register in order to buffer-store a burst containing the bits of m≧2 successive bit packets that are to be read from the respective memory device; and the access control device is activated during a read operation in order to transfer, at each respective memory device, the bits of a burst to be output in the parallel format from assigned memory cells into the respective prefetch register.

12. The memory module of claim 10, wherein a length m of the burst is such that the expression KN*L*m/N is a natural number.

13. The memory module of claim 11, wherein a length m of the burst is such that the expression KN*L*m/N is a natural number.

14. A system, comprising the memory module of claim 1 and a plurality of electrical components, the plurality of electrical components being at least one of structurally and functionally related.

15. The system of claim 14, wherein at least one of the plurality of electrical components is a memory controller.

16. A system, comprising the memory module of claim 6 and a plurality of electrical components, the plurality of electrical components being at least one of structurally and functionally related.

17. The system of claim 16, wherein at least one of the plurality of electrical components is a memory controller.

* * * * *